United States Patent
Leal et al.

(10) Patent No.: US 7,579,219 B2
(45) Date of Patent: Aug. 25, 2009

(54) SEMICONDUCTOR DEVICE WITH A PROTECTED ACTIVE DIE REGION AND METHOD THEREFOR

(75) Inventors: George R. Leal, Cedar Park, TX (US); Owen R. Fay, Gilbert, AZ (US); Robert J. Wenzel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 658 days.

(21) Appl. No.: 11/373,087

(22) Filed: Mar. 10, 2006

(65) Prior Publication Data

US 2006/0192301 A1  Aug. 31, 2006

(51) Int. Cl.
*H01L 21/50* (2006.01)
*H01L 21/48* (2006.01)
*H01L 21/44* (2006.01)

(52) U.S. Cl. .................. 438/127; 438/112; 438/124; 438/126

(58) Field of Classification Search ............... None
See application file for complete search history.

(56) References Cited

U.S. PATENT DOCUMENTS

| | | | |
|---|---|---|---|
| 4,630,096 A | 12/1986 | Drye et al. |
| 4,722,914 A | 2/1988 | Drye et al. |
| 4,783,695 A | 11/1988 | Eichelberger et al. |
| 4,792,533 A | 12/1988 | Drye et al. |
| 4,890,156 A | 12/1989 | Drye et al. |
| 5,147,815 A | 9/1992 | Casto |
| 5,161,093 A | 11/1992 | Gorczyca et al. |
| 5,222,014 A | 6/1993 | Lin |
| 5,315,486 A | 5/1994 | Fillion et al. |
| 5,353,498 A | 10/1994 | Fillion et al. |
| 5,495,398 A | 2/1996 | Takiar et al. |
| 5,592,025 A | 1/1997 | Clark et al. |
| 5,841,193 A | 11/1998 | Eichelberger |
| 5,989,935 A | 11/1999 | Abbott |
| 6,001,672 A | 12/1999 | Wensel |
| 6,159,767 A | 12/2000 | Eichelberger |
| 6,211,462 B1 | 4/2001 | Carter, Jr. et al. |
| 6,225,688 B1 | 5/2001 | Kim et al. |

(Continued)

FOREIGN PATENT DOCUMENTS

EP  0 777 274 A1  6/1997

(Continued)

*Primary Examiner*—N Drew Richards
*Assistant Examiner*—Khanh B Duong
(74) *Attorney, Agent, or Firm*—Robert L. King (57) ABSTRACT

A semiconductor device includes a semiconductor die having a plurality of contact pad sites, a plurality of contact pads, an encapsulant barrier, and an encapsulant. A plurality of contact pads is in electrical contact with a predetermined corresponding different one of the contact pad sites. An encapsulant barrier is positioned at an outer perimeter of the semiconductor die. The encapsulant barrier has a height that is as high as or greater than a highest of the plurality of contact pads. The encapsulant barrier is in physical contact with a same surface of the semiconductor die as the contact pad sites. An encapsulant surrounds the semiconductor die and one side of the encapsulant barrier. The encapsulant is blocked from making physical contact with any of the plurality of contact pads by the encapsulant barrier when the device is encapsulated while being supported by a temporary base support layer.

16 Claims, 6 Drawing Sheets

U.S. PATENT DOCUMENTS

| | | |
|---|---|---|
| 6,329,224 B1 | 12/2001 | Nguyen et al. |
| 6,376,914 B2 | 4/2002 | Kovats et al. |
| 6,403,387 B1 | 6/2002 | Wensel |
| 6,426,565 B1 | 7/2002 | Bhatt et al. |
| 6,617,524 B2 | 9/2003 | Vo |
| 6,661,083 B2 | 12/2003 | Lee et al. |
| 2001/0013643 A1 | 8/2001 | Nakanishi et al. |
| 2002/0064931 A1 | 5/2002 | Ong |
| 2003/0087088 A1 | 5/2003 | Tachibana et al. |
| 2004/0033644 A1 | 2/2004 | Wensel |

FOREIGN PATENT DOCUMENTS

| | | |
|---|---|---|
| EP | 0 680 086 B1 | 9/2001 |
| JP | 03-084338 | 4/1991 |
| JP | 03-132876 | 6/1991 |
| WO | WO 02/21595 A2 | 3/2002 |
| WO | WO 02/33751 A2 | 4/2002 |

SEMICONDUCTOR DEVICE WITH A PROTECTED ACTIVE DIE REGION AND METHOD THEREFOR

FIELD OF THE INVENTION

The present invention relates to semiconductor devices, and more specifically to protecting specific regions of semiconductor devices.

RELATED ART

During the semiconductor manufacturing process, it is often desirable to prevent molding material from bleeding over to active regions of the semiconductor. That is, during the encapsulation process of manufacturing semiconductor devices, the molding material used to encapsulate the semiconductor die (e.g., resin) can bleed over to active regions of the semiconductor where such molding material is undesired.

Current bleed prevention techniques utilize trenches or dams to prevent the molding material from bleeding onto the substrate or lead frame leads. However, if, for example, the trench or damn depth is not sufficient enough to hold the molding material, these techniques will not necessarily prevent the molding material from bleeding onto the die face itself. Other bleed prevention techniques rely on high clamping force to prevent resin from bleeding onto the exposed pad of an exposed pad package. Although the high clamping force may prove useful in some situations, using such a method is sometimes unpredictable in terms of reliability and yield. Another way to deal with molding material that has bleed over into active regions of the semiconductor die is to apply surface treatments to prevent wetting on the active region or to remove the unwanted molding material. Although using surface treatments may prevent or facilitate removal of the unwanted molding material, the excess chemicals utilized often have undesirable effects on the active regions of the semiconductor die.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

There is disclosed herein an improved encapsulant bleed prevention technique that prevents molding material from permeating an active region of a semiconductor die. In one embodiment, a semiconductor device includes a semiconductor die, a plurality of contact pads, an encapsulant barrier, a first layer, a second layer, and an encapsulant. The semiconductor die has a first surface and a second surface that are opposite each other. The first surface of the semiconductor die has a plurality of contact pad sites. Each of the plurality of contact pads have substantially the same predetermined height and have a first end and a second end. The first end of each of the plurality of contact pads is in electrical contact with a predetermined corresponding different one of the plurality of contact pad sites. The encapsulant barrier is positioned at a periphery of the plurality of contact pads and has substantially the same predetermined height of the plurality of contact pads. The encapsulant barrier is in physical contact with the first surface of the semiconductor die. The first layer has a first surface and a second surface, the first surface of the first layer being in direct physical contact with the second end of each of the plurality of contact pads. The second layer is in direct physical contact with the first layer. The encapsulant surrounds the second surface of the semiconductor die and is blocked from making physical contact with any of the plurality of contact pads by the encapsulant barrier. The first layer and the second layer are releasable from the semiconductor die after curing of the encapsulant. In one form the encapsulant barrier is a same material as the plurality of contact pads. In another form the encapsulant barrier is a different material than the plurality of contact pads.

In one embodiment, a semiconductor device includes a semiconductor die, a plurality of contact pads, an encapsulant barrier, a removable first layer, a second removable layer, and an encapsulant. The semiconductor die has a plurality of contact pad sites. The plurality of contact pads are in electrical contact with a predetermined corresponding different one of the plurality of contact pad sites. The encapsulant barrier is positioned at an outer perimeter of the semiconductor die. The encapsulant barrier has a height that is substantially as large as a highest of the plurality of contact pads. The encapsulant barrier is in physical contact with a same surface of the semiconductor die as the contact pad sites. The removable first layer has a first surface and a second surface. The first surface of the first layer is in direct physical contact with each of the plurality of contact pads. The second removable layer is in direct physical contact with the first removable layer. The encapsulant surrounds the semiconductor die but is blocked from making physical contact with any of the plurality of contact pads by the encapsulant barrier. The first layer and the second layer are removed from the semiconductor die after curing of the encapsulant.

In one embodiment, a semiconductor device includes a semiconductor die, a plurality of contact pads, an encapsulant barrier, and an encapsulant. The semiconductor die has a plurality of contact pad sites. The plurality of contact pads are in electrical contact with a predetermined corresponding different one of the plurality of contact pad sites. The encapsulant barrier is positioned at an outer perimeter of the semiconductor die. The encapsulant barrier has a height that is as high as or less than a highest of the plurality of contact pads. The encapsulant barrier is in physical contact with a same surface of the semiconductor die as the contact pad sites. The encapsulant surrounds the semiconductor die and one side of the encapsulant barrier. The encapsulant is blocked from making physical contact with any of the plurality of contact pads by the encapsulant barrier when the device is encapsulated while being supported by a temporary base support layer.

Another embodiment of the present invention relates to a method of protecting a semiconductor die during encapsulation. A plurality of contact pad sites is provided on a side of the semiconductor die. A plurality of contact pads are formed within the plurality of contact pad sites. Each of the plurality of contact pads have substantially the same predetermined height and have a first end and a second end. The first end of each of the plurality of contact pads are in electrical contact with a predetermined corresponding different one of the plurality of contact pad sites. An encapsulant barrier is provided at a periphery of the plurality of contact pads. The encapsulant barrier has substantially the same predetermined height of the plurality of contact pads. The encapsulant barrier is in physical contact with the first surface of the semiconductor die. A first layer is provided having a first surface and a second surface. The first surface of the first layer is in direct physical contact with the second end of each of the plurality of contact pads. A second layer is provided that is in direct physical contact with the first layer. The second surface of the semiconductor die is encapsulated and the encapsulant is blocked from making physical contact with any of the plurality of contact pads by the encapsulant barrier. The first layer and the second layer are removed from the semiconductor die after the encapsulant has cured.

Figure 1:
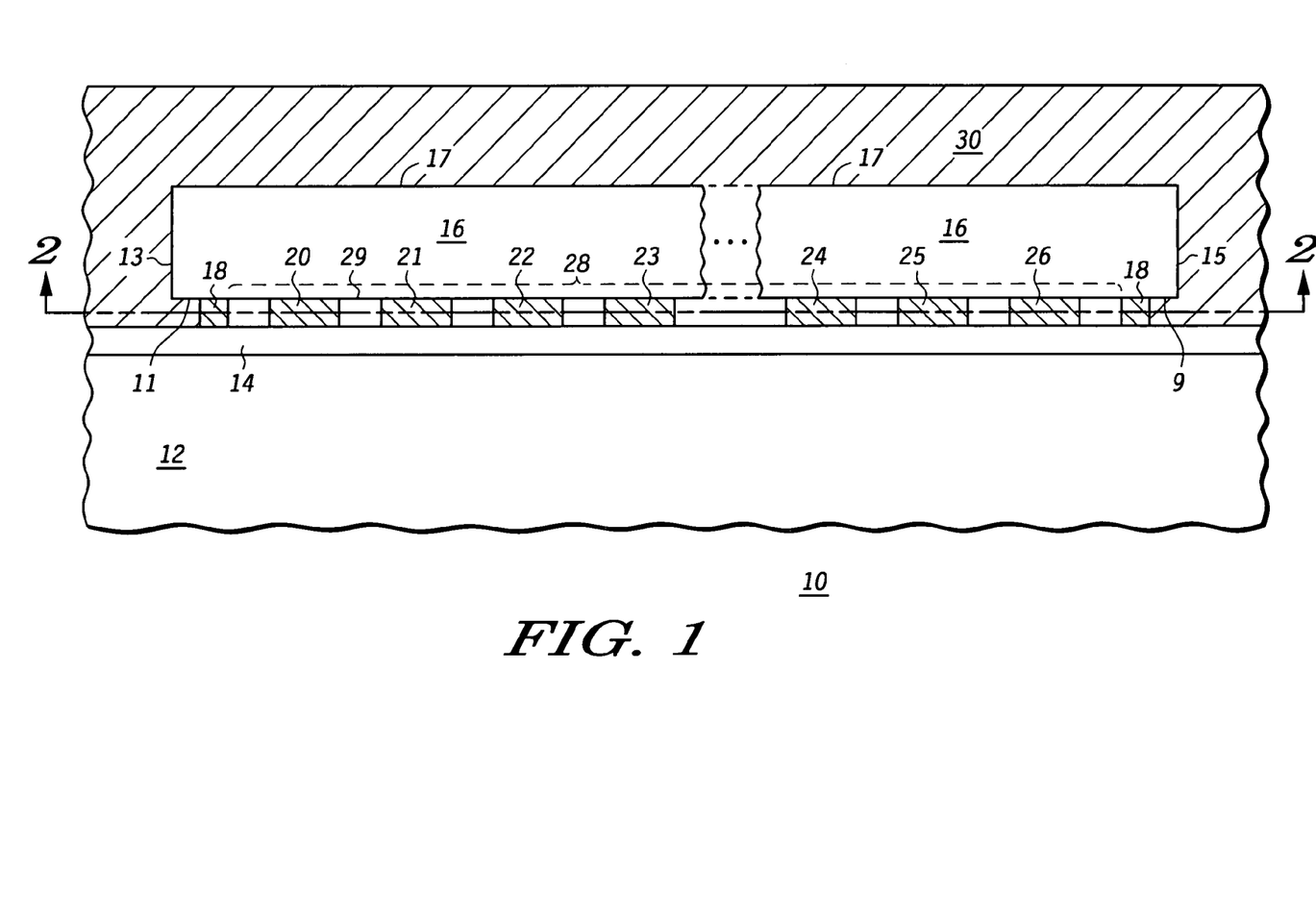
FIG. 1 illustrates a cross-sectional view of a semiconductor device in accordance with one embodiment of the present invention.

FIG. 1 illustrates a semiconductor device 10 according to one embodiment of the present invention. Semiconductor device 10 includes a base layer 12, an adhesive layer 14, a semiconductor die 16, an encapsulant barrier 18, a contact pad 20, a contact pad 21, a contact pad 22, a contact pad 23, a contact pad 24, a contact pad 25, a contact pad 26, an active surface 28, and an encapsulant 30.

In one embodiment of the present invention, adhesive layer 14 may be formed of any material that is adhesive. In one form, adhesive layer 14 is a tape having an adhesive surface in contact with contact pads 20-26. In another form, adhesive layer 14 is a silicone or acrylic-based material. For some embodiments, adhesive layer 14 may be removed, for example, if the adhesive layer 14 is an adhesive tape.

In one embodiment of the present invention, encapsulant 30 may be any type of non-electrically conductive material that can be molded, such as, for example, thermoset mold compounds or filled thermoplastic resins which act as insulating materials. In alternate embodiments of the present invention, encapsulant 30 may be any type of electrically conductive material that can be molded, such as, for example, thermoset epoxy with metallic filler or thermoplastic with metallic filler. The metallic filler may be any suitable electrically conductive material, such as, for example, silver, copper, electrically conductive coated polymer spheres, and conductive nano-particles. The metallic filler may be in particle form. In one embodiment, encapsulant barrier 18 may be formed of metal, such as aluminum, copper, aluminum alloys, copper alloys, etc. In another embodiment, encapsulant barrier 18 may be polyimide, or other organic base passivation materials.

During the semiconductor manufacturing process, contact pads 20-26 and encapsulant barrier 18 are formed on active region 28 of semiconductor die 16 using standard metallization techniques, such as, for example, an additive plating technique or a subtractive etching technique. In the embodiment, active region 28 includes a plurality of contact pads 20-26 and the corresponding air gaps (spaces) located between contact pads 20-26. Alternate embodiments of the present invention may include a greater or lesser number of contact pads than those shown in FIG. 1. In the illustrated embodiment, active region 28 excludes the portion of the semiconductor die 16 outside of encapsulation barrier 18. In alternate embodiments, active region 28 may include other portions of semiconductor die 16 within other encapsulation barriers. In one embodiment, active region 28 of semiconductor die 16 is adhesively coupled to adhesive layer 14. In addition, adhesive layer 14 is adhesively coupled to base layer 12 in such a fashion that both the adhesive layer 14 and base layer 12 may be removed.

For ease of explanation, semiconductor 16 has been separated into several portions: a top portion 17, a side portion 13, a side portion 15, a partial-bottom portion 11, a partial-bottom portion 9, and a bottom surface 29. Top portion 17, side portion 13, side portion 15, partial-bottom portion 11, and partial-bottom portion 9 of semiconductor die 16 are encapsulated up to encapsulant barrier 18 using encapsulant 30. Encapsulant 30 may be provided using any appropriate encapsulating method, such as, for example, dispense, injection or transfer molding, screen printing or extrusion coating. Encapsulant barrier 18 when in contact with adhesive layer 14 acts as a barrier to prevent encapsulant 30 from bleeding onto active region 28. In one embodiment, after encapsulation occurs, adhesive layer 14 and base layer 12 are removed allowing contact pads 20-26 to be available conductors free of encapsulant 30.

As stated previously, the use of encapsulation barrier 18 prevents encapsulant 30 from bleeding onto or permeating active region 28 of semiconductor die 16. In one embodiment, encapsulation barrier 18 may be located at several locations on semiconductor die 16, such that encapsulation barrier 18 surrounds a region or regions of semiconductor die 16 (active or non-active), that are to remain free of encapsulant 30. For example, in one embodiment encapsulation barrier 18 may be located around the perimeter of semiconductor device 16 such that encapsulation barrier 18 is in the form of a ring. Alternatively, encapsulation barrier 18 may take the form of shapes other than a ring. For example, in one embodiment encapsulation barrier 18 may be in the form of a spiral, spiraling around contact pads that are to remain free of encapsulant 30.

The height of encapsulation barrier 18 may vary depending on the height of contact pads 20-26 being used by semiconductor device 10. In one embodiment, the height of the encapsulant barrier 18 must be at least the height of the contact pad of contact pads 20-26 that has the maximum height. That is, the height of contact pads 20-26 may vary, but as long as the height of encapsulation barrier 18 is at least the height of the contact pad with the maximum height, encapsulation barrier 18 will prevent encapsulant 30 from permeating beyond encapsulant barrier 18.

Encapsulation barrier 18 may be formed at different times within the semiconductor manufacturing process. The exact time when encapsulation barrier 18 is formed varies depending on the metallization process, panelization process, etc., being used to manufacture semiconductor device 10. For example, encapsulant barrier 18 may be formed using redistribution metal added to semiconductor die 16.

Figure 2:
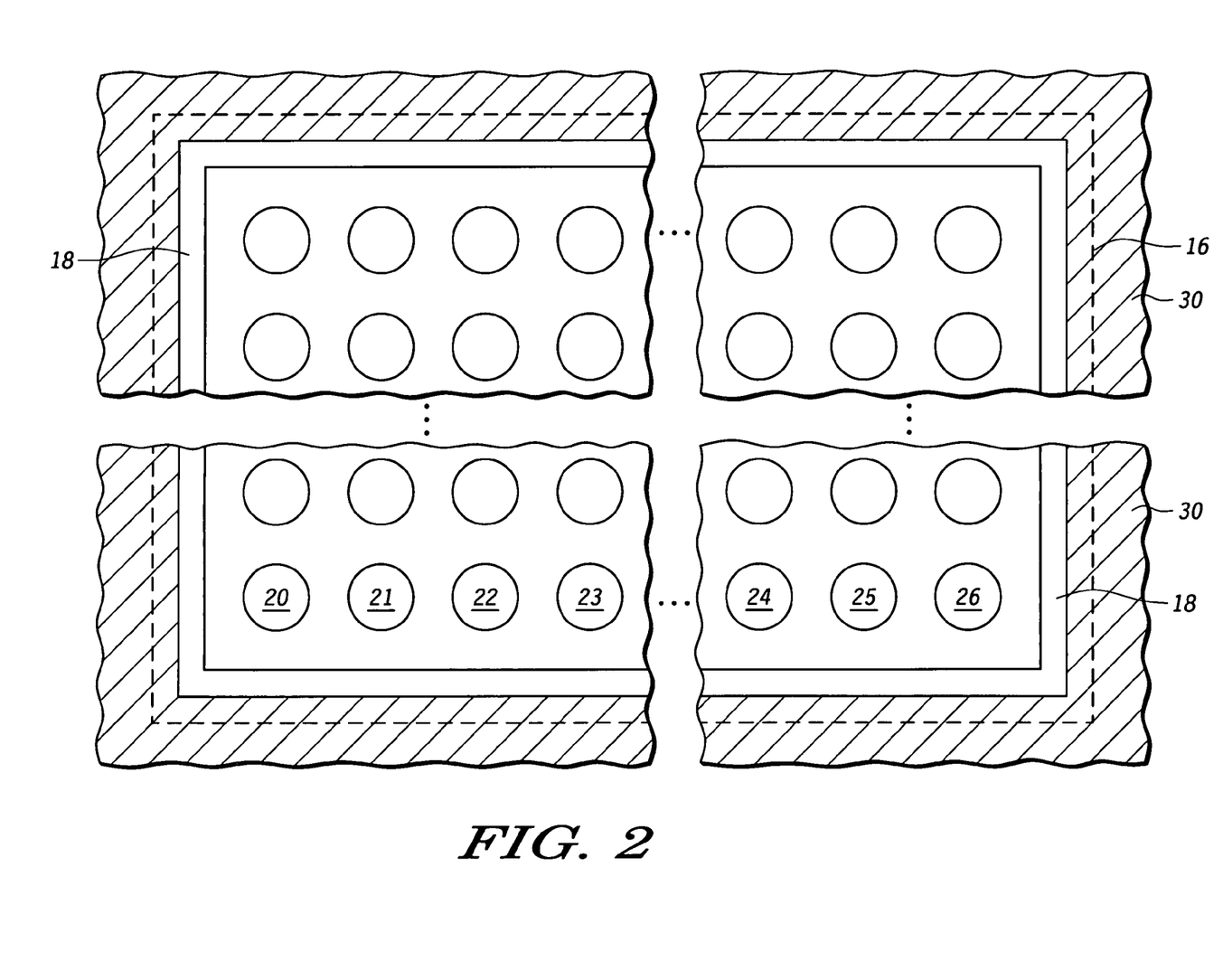
FIG. 2 illustrates the semiconductor device of FIG. 1 taken along line 2-2.

FIG. 2 illustrates a bottom view of semiconductor device 10 depicted in FIG. 1. In the embodiment shown, encapsulant barrier 18 is positioned along the outer edges of semiconductor die 16 surrounding the contact pads, such as contact pads 20-26. Encapsulant barrier 18 prevents encapsulant 30 of FIG. 1 from bleeding into active region 28 of FIG. 1.

Figure 3:
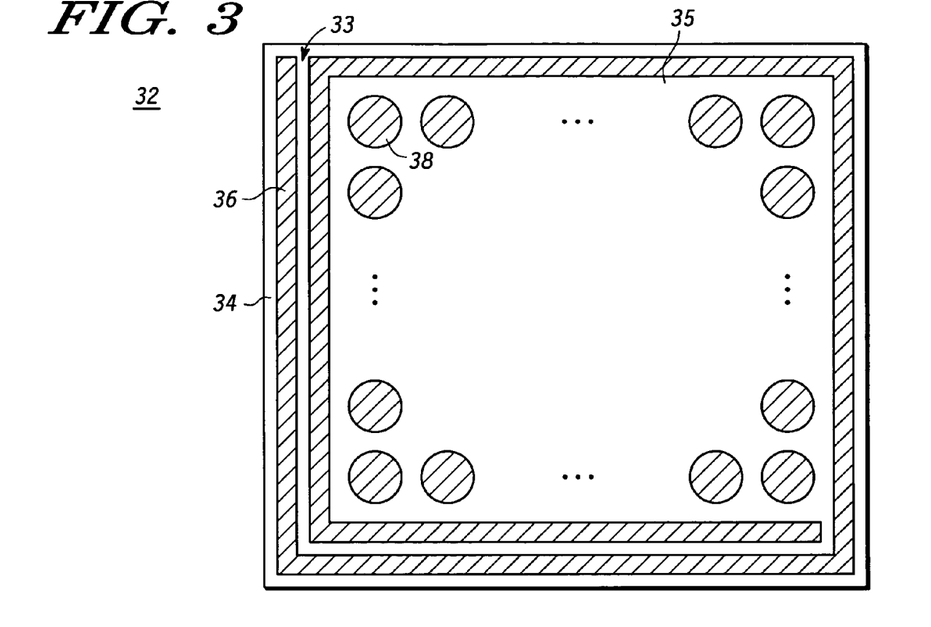
FIG. 3 illustrates a bottom view of a semiconductor device, in accordance with one embodiment of the present invention.

FIG. 3 illustrates a semiconductor device 32 according to one embodiment of the present invention. Semiconductor device 32 may be manufactured according to the manufacturing processes described earlier in the description of FIG. 1. An encapsulation barrier 36 is located on semiconductor die 34. Encapsulation barrier 36 surrounds the contact pads such as contact pad 38. In one embodiment, encapsulation barrier 36 is in the form of a spiral having a height substantially equivalent to the tallest of the contact pads, such as contact pad 38, as measured from the die surface. Encapsulation barrier 36 has a vent opening 33 which allows for expanding gases to be released out of active region 35 while preventing encapsulant 30 of FIGS. 1 and 2 from entering active region 35.

Figure 4:
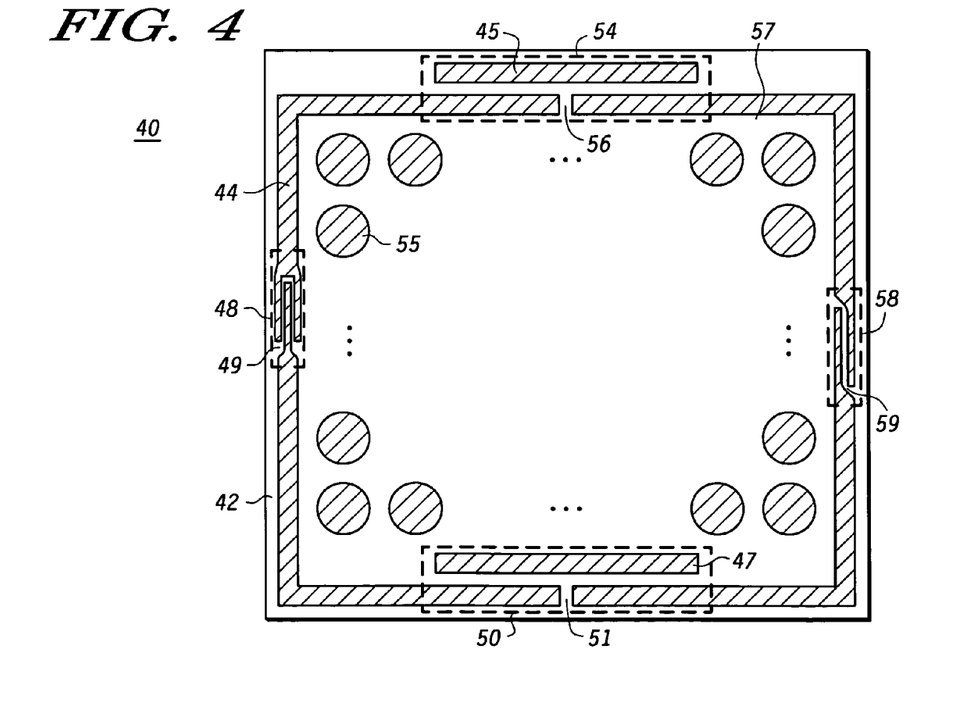
FIG. 4 illustrates a bottom view of a semiconductor device, in accordance with another embodiment of the present invention.

FIG. 4 illustrates a semiconductor device 40 according to one embodiment of the present invention. Semiconductor device 40 includes semiconductor die 42, a plurality of contact pads such as contact pad 55, encapsulation barrier 44, active region 57, vent 49, vent 51, vent 56, and vent 59. In one embodiment, semiconductor device 40 includes several variations of ventilation, such as, for example, venting portion 48, venting portion 54, venting portion 58, and venting portion 50. Each venting portion 48, 54 and 58 is illustrated in FIG. 4 by a dashed line solely for purposes of illustration and does not indicate a hidden underlying structure. Each venting portion allows for expanding gases to be circulated out of active region 57 while preventing encapsulant 30 of FIGS. 1 and 2 from entering active region 57. In one embodiment, encapsulation barrier 45 is placed parallel to the portion of encapsulation barrier 44 having vent 56. In another embodiment, encapsulation barrier 47 is placed inside active region 57 and parallel to the portion of encapsulation barrier 44 having vent 51. In one embodiment, venting portion 48 takes the shape of an elongated staple having a portion of encapsulation barrier 44 fit into its opening. Other embodiments of ventilating portions may exist that take the form of the ventilating portions shown or not shown.

Figure 5:
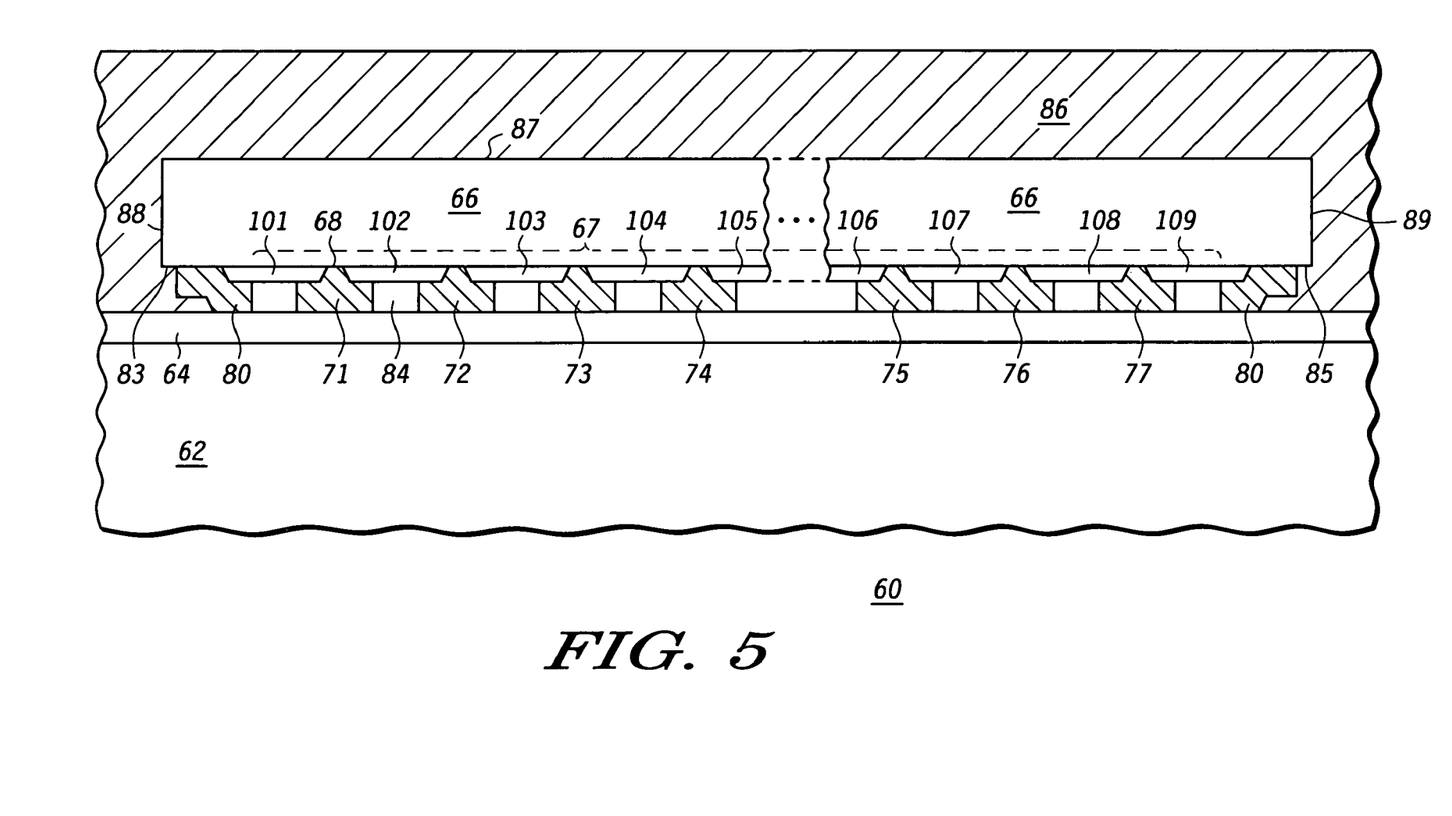
FIG. 5 illustrates a cross-sectional view of a semiconductor device, in accordance with one embodiment of the present invention.

FIG. 5 illustrates a semiconductor device 60 according to one embodiment of the present invention. In one embodiment, semiconductor device 60 includes a base layer 62, an adhesive layer 64, a semiconductor die 66, an encapsulant barrier 80, a contact pad 71, a contact pad 72, a contact pad 73, a contact pad 74, a contact pad 75, a contact pad 76, and a contact pad 77. Semiconductor device 60 further includes an active region 67, and a passivation layer having a passivation layer portion 101, a passivation layer portion 102, a passivation layer portion 103, a passivation layer portion 104, a passivation layer portion 105, a passivation layer portion 106, a passivation layer portion 107, a passivation layer portion 108 and a passivation layer portion 109. Semiconductor device 60 also includes an encapsulant 86 and an air gap 84.

In one embodiment of semiconductor device 60 illustrated in FIG. 5, adhesive layer 64 may be formed of any material that is adhesive. In one embodiment, adhesive layer 64 is a tape having an adhesive surface in contact with contact pads 71-77. In an alternate embodiment, adhesive layer 64 may be an epoxy based material. For some embodiments of the present invention, adhesive layer 64 may be removed, for example, if the adhesive layer 64 is an adhesive tape.

In some embodiments of the present invention, encapsulant 86 may be any type of non-electrically conductive material that can be molded, such as, for example, thermoset mold compounds or filled thermoplastic resins which act as insulating materials. In alternate embodiments of the present invention, encapsulant 30 may be any type of electrically conductive material that can be molded, such as, for example, thermoset epoxy with metallic filler or thermoplastic with metallic filler. The metallic filler may be any suitable electrically conductive material, such as, for example, silver, copper, electrically conductive coated polymer spheres, and conductive nano-particles. The metallic filler may be in particle form. In one embodiment, encapsulant barrier 80 may be formed of metal, such as aluminum, copper, aluminum alloys, copper alloys, etc. In another embodiment, encapsulant barrier 80 may be polyimide, or other organic base passivation materials.

Referring to semiconductor device 60, during the manufacturing process, the passivation layer formed of portions 101-109 is formed on semiconductor die 66. In one embodiment, contact pads 71-77 and encapsulant barrier 80 are formed on active region 67 of semiconductor die 66 using any one of various metallization techniques known in the art. In one embodiment, the passivation layer formed of portions 101-109 is interposed between contact pads 71-77 and the bottom surface 68 of semiconductor die 66. An air gap 84 surrounds contact pads 71-77. The air gap 84 is enclosed within encapsulant barrier 80 and between adhesive layer 64 and the passivation layer formed of portions 101-109. Alternate embodiments of the present invention may include a greater or lesser number of contact pads in active region 67. In the illustrated embodiment, active region 67 may be considered the bottom of semiconductor die 66, excluding the portions of the semiconductor die 66 outside of encapsulant barrier 80. In alternate embodiments, active region 67 may include other portions of semiconductor die 66 within encapsulant barrier 80. In one embodiment, active region 67 of semiconductor die 66 is adhesively coupled to adhesive layer 64. In addition, adhesive layer 64 is adhesively coupled to base layer 62 which allows adhesive layer 64 and base layer 62 to be removed.

For ease of explanation, semiconductor 60 has been separated into several portions: a top portion 87, a side portion 88, a side portion 89, a partial-bottom portion 83, and a partial-bottom 85. Top portion 87, side portion 88, side portion 89, partial-bottom portion 83, and partial-bottom portion 85 of semiconductor die 66 are encapsulated up to encapsulant barrier 80 using encapsulant 86. Encapsulant 86 is provided using any appropriate encapsulating method, such as, for example, injection molding or transfer molding. Other methods of encapsulation may alternately be used, such as, for example, dispense molding, screen printing or extrusion coating. In one embodiment, encapsulant barrier 80 acts as a barrier to prevent encapsulant 86 from bleeding onto active region 67. It should be noted that in the embodiment of FIG. 5 that encapsulant barrier 80 laps over the edge of the passivation layer having portions 101-109 so that a portion of the encapsulant barrier 80 is in direct contact with die surface 68 while the other portion of encapsulant barrier 80 is located entirely between the passivation layer formed of portions 101-109 and the adhesive layer 64. Adhesive layer 64 and base layer 62 may then be removed allowing contact pads 71-77 to be available as contact pads free of encapsulant 86.

Figure 6:
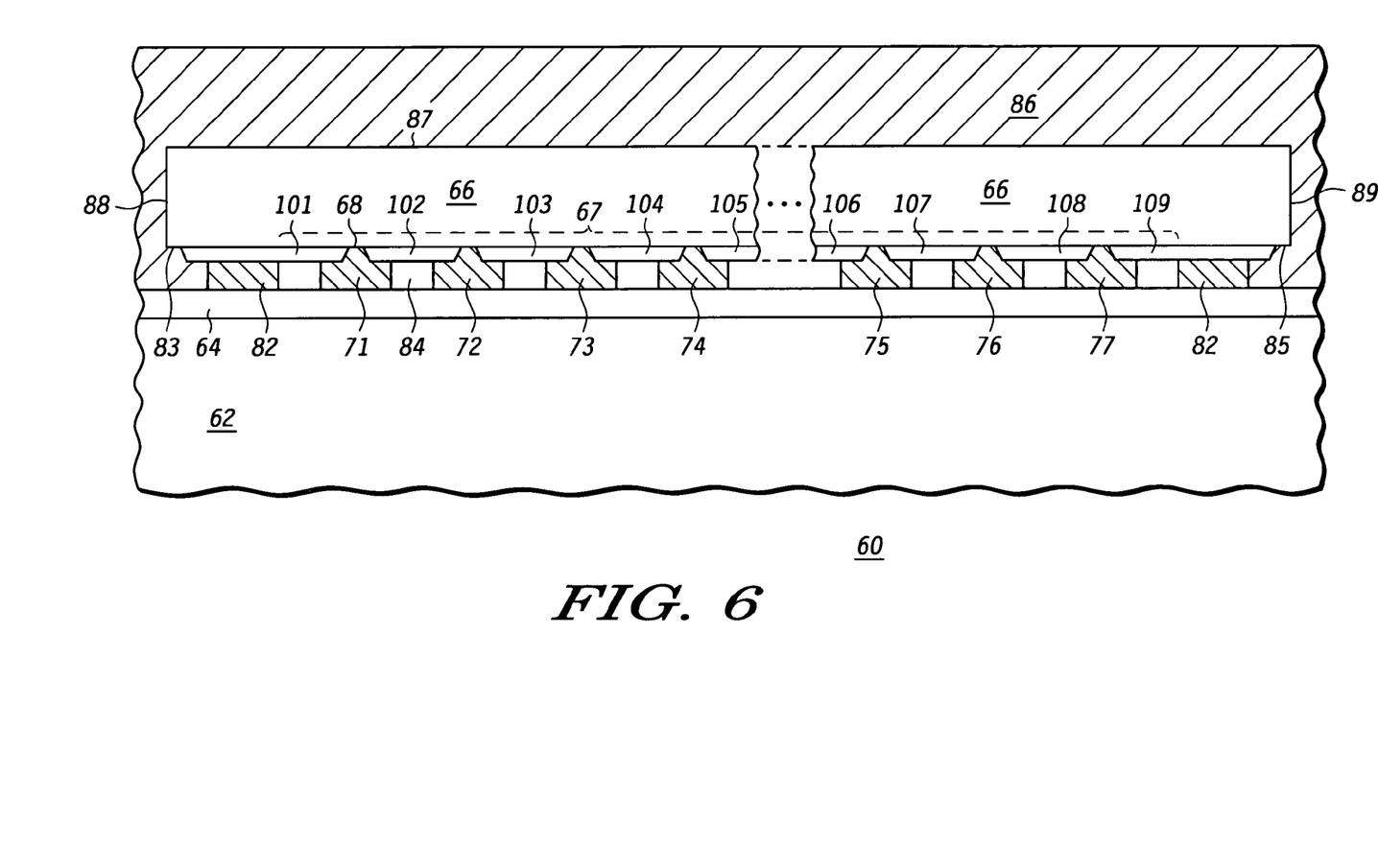
FIG. 6 illustrates a cross-sectional view of a semiconductor device, in accordance with another embodiment of the present invention.

FIG. 6 illustrates semiconductor device 60 according to one embodiment of the present invention. In one embodiment shown in FIG. 6, encapsulant barrier 80 of FIG. 5 has been replaced with encapsulant barrier 82, the entire portion of which is located entirely between the passivation layer having portions 101-109 and the adhesive layer 64, thereby forming a seal. The description of the semiconductor device 60 of FIG. 5 applies to the description of semiconductor device 60 of FIG. 6 and will not be discussed further in detail.

Figure 7:
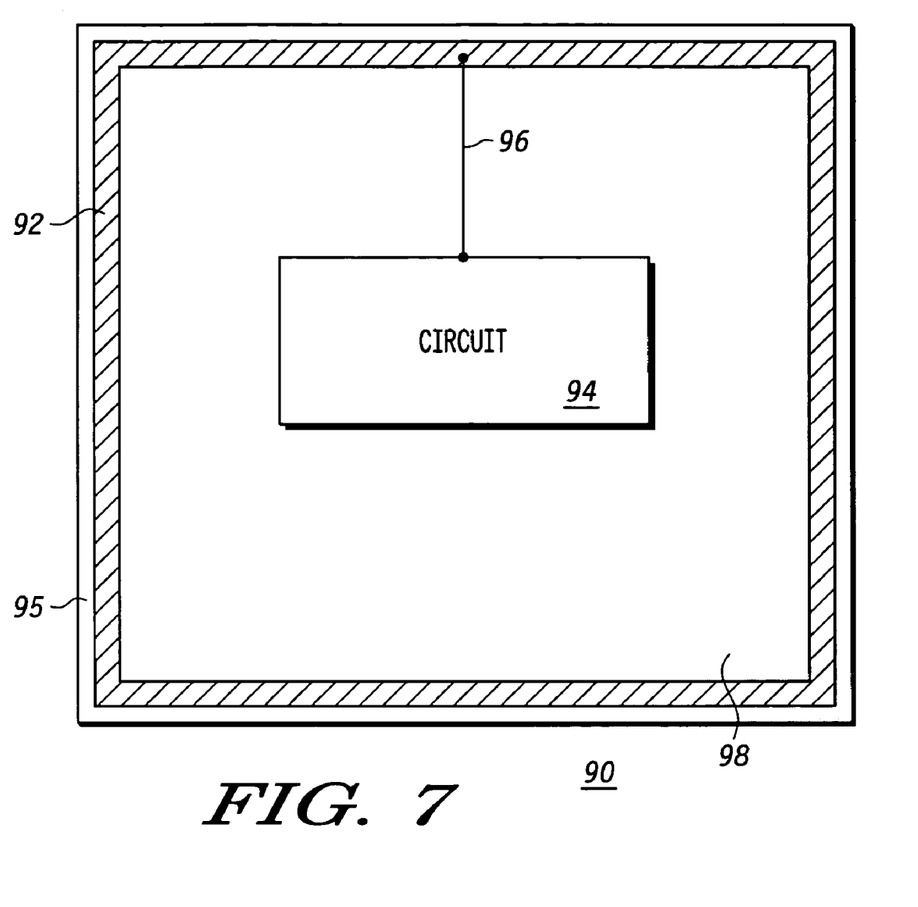
FIG. 7 illustrates a bottom plan view of a semiconductor device, in accordance with another embodiment of the present invention.

FIG. 7 illustrates a bottom plan view of a semiconductor device 90 according to one embodiment of the present invention. Semiconductor device 90 includes a semiconductor die 95, a circuit 94, an active region 98, an encapsulation barrier 92, and a conductor 96. Circuit 94 may be positioned in any area of the semiconductor die 95 and may be of any size. It should be understood that as illustrated FIG. 7 is not necessarily drawn to scale. In one embodiment, conductor 96 provides conductive connection between circuit 94 and encapsulation barrier 92. In addition, encapsulation barrier 92 serves not only to prevent encapsulant material 30 of FIGS. 1 and 2 from bleeding onto active region 98, but may also serve as a conductor to propagate or shield electrical signals. In one embodiment, encapsulant barrier 92 may be used as an electrical shield for circuit 94 to isolate electromagnetic interference. In another embodiment, encapsulant barrier 92 may be electrically coupled to circuit 94 and used to implement an electrical function in the circuit. For example, in one embodiment encapsulant barrier 92 may be used as an antenna. In another embodiment, encapsulant barrier 92 may implement the electrical function of an inductor.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term substantially, as used herein, is defined as at least approaching a given state or value (e.g., preferably within 10% of).

The invention claimed is:

1. A method of protecting a semiconductor die during encapsulation comprising:

providing a plurality of contact pad sites on a side of the semiconductor die;

forming a plurality of contact pads within the plurality of contact pad sites, each of the plurality of contact pads having a substantially same predetermined height and having a first end and a second end, the first end of each of the plurality of contact pads being in electrical contact with a predetermined corresponding different one of the plurality of contact pad sites;

providing an encapsulant barrier at a periphery of the plurality of contact pads, the encapsulant barrier having a first surface and a second surface, the encapsulant barrier being substantially the same predetermined height of the plurality of contact pads, the encapsulant barrier being in physical contact with a first surface of the semiconductor die;

providing a first layer having a first surface and a second surface, the first surface of the first layer being in direct physical contact with the second surface of the encapsulant barrier;

providing a second layer in direct physical contact with the first layer;

encapsulating the second surface of the semiconductor die and blocking an encapsulant from making physical contact with any of the plurality of contact pads by the encapsulant barrier; and removing the first layer and the second layer from the semiconductor die after the encapsulant has cured.

2. The method of claim 1 further comprising:

providing at least one vent in the encapsulant barrier for releasing any expanding gases within air spaces separating the plurality of contact pads.

3. The method of claim 1 further comprising:

providing a circuit on the semiconductor die and using the encapsulant barrier as one of an electrical shield for the circuit to isolate electromagnetic interference, an antenna or an inductor.

4. The method of claim 1 further comprising:

providing a circuit on the semiconductor die; and electrically coupling the circuit to the encapsulant barrier for using the encapsulant barrier to implement an electrical function in the circuit.

5. A method of protecting a semiconductor die during encapsulation comprising:

providing the semiconductor die with a first surface and a second surface that are opposite each other, the first surface having a plurality of contact pad sites;

providing a plurality of contact pads, each of the plurality of contact pads having a substantially same predetermined height and having a first end and a second end, the first end of each of the plurality of contact pads being in electrical contact with a respective one of the plurality of contact pad sites;

positioning an encapsulant barrier substantially only at a periphery of the plurality of contact pads, the encapsulant barrier having substantially the same predetermined height of the plurality of contact pads, the encapsulant barrier having a first surface and an opposing second surface, the first surface being in physical contact with the first surface of the semiconductor die;

providing a first layer having a first surface and a second surface, the first surface of the first layer being in direct physical contact with the second surface of the encapsulant barrier and the second end of each of the plurality of contact pads;

providing a second layer in direct physical contact with the first layer;

providing an encapsulant surrounding the second surface of the semiconductor die and being blocked from making physical contact with any of the plurality of contact pads by the encapsulant barrier; and releasing the first layer and the second layer from the semiconductor die after curing of the encapsulant.

6. The method of claim 5 further comprising providing at least one vent in the encapsulant barrier for release of any expanding gases within air space separating the plurality of contact pads.

7. The method of claim 5 further comprising forming the encapsulant barrier with a same material as the plurality of contact pads.

8. The method of claim 5 further comprising forming the encapsulant barrier with a different material than the plurality of contact pads.

9. The method of claim 5 further comprising:
implementing a circuit on the semiconductor die, wherein the encapsulant barrier is either an electrical shield to isolate the circuit from electromagnetic interference or functions as an antenna or an inductor for the circuit.

10. The method of claim 5 further comprising electrically coupling the circuit to the encapsulant barrier.

11. The method of claim 5 further comprising:
implementing a circuit on the semiconductor die, the circuit being electrically coupled to the encapsulant barrier for using the encapsulant barrier to implement an electrical function in the circuit.

12. The method of claim 5 further comprising:
interposing a passivation layer between the plurality of contact pads and the first surface of the semiconductor die, wherein a portion of the encapsulant barrier is in physical contact with the passivation layer.

13. A method of protecting a semiconductor die during encapsulation comprising, comprising:
providing a plurality of contact pad sites on the semiconductor die;
providing a plurality of contact pads in electrical contact with a predetermined corresponding different respective one of the plurality of contact pad sites;
positioning an encapsulant barrier substantially only at an outer perimeter of the semiconductor die, the encapsulant barrier having a height that is substantially as large as a highest of the plurality of contact pads, the encapsulant barrier having a first surface and a second surface, the first surface being in physical contact with a same surface of the semiconductor die as the plurality of contact pad sites;
providing a removable first layer having a first surface and a second surface, the first surface of the removable first layer being in direct physical contact with the second surface of the encapsulant barrier;
providing a second removable second layer in direct physical contact with the removable first layer;
providing an encapsulant surrounding the semiconductor die but being blocked from making physical contact with any of the plurality of contact pads by the encapsulant barrier; and
removing the removable first layer and the removable second layer from the semiconductor die after curing of the encapsulant.

14. The method of claim 13 further comprising:
forming at least one vent in the encapsulant barrier for release of any expanding gases within an air space separating the plurality of contact pads.

15. The method of claim 13 further comprising:
implementing a circuit on the semiconductor die, wherein the encapsulant barrier is either an electrical shield to isolate the circuit from electromagnetic interference or functions as an antenna or an inductor for the circuit.

16. The method of claim 13 further comprising:
implementing a circuit implemented on the semiconductor die; and
electrically coupling the circuit to the encapsulant barrier for using the encapsulant barrier to implement an electrical function in the circuit.

* * * * *